United States Patent
Jonckheere et al.

(10) Patent No.: US 10,353,284 B2
(45) Date of Patent: Jul. 16, 2019

(54) LITHOGRAPHIC RETICLE SYSTEM

(71) Applicants: IMEC VZW, Leuven (BE); Imec USA Nanoelectronics Design Center, Kissimmee, FL (US)

(72) Inventors: Rik Jonckheere, Mechelen (BE); Cedric Huyghebaert, Heverlee (BE); Emily Gallagher, Bulington, VT (US)

(73) Assignees: IMEC VZW, Leuven (BE); IMEC USA NANOELECTRONICS DESIGN CENTER, Kissimmee, FL (US)

( * ) Notice: Subject to any disclaimer, the term of this patent is extended or adjusted under 35 U.S.C. 154(b) by 0 days.

(21) Appl. No.: 15/979,813

(22) Filed: May 15, 2018

(65) Prior Publication Data

US 2018/0329290 A1 Nov. 15, 2018

(30) Foreign Application Priority Data

May 15, 2017 (EP) .................................... 17171170

(51) Int. Cl.
  *G03F 7/20* (2006.01)
  *G03F 1/64* (2012.01)
  *G03F 1/62* (2012.01)

(52) U.S. Cl.
  CPC .............. *G03F 1/64* (2013.01); *G03F 1/62* (2013.01); *G03F 7/70825* (2013.01); *G03F 7/70975* (2013.01); *G03F 7/70983* (2013.01)

(58) Field of Classification Search
  CPC ............ G03F 7/70983; G03F 7/70825; G03F 7/70975

USPC ...................................................... 355/72–76
See application file for complete search history.

(56) References Cited

U.S. PATENT DOCUMENTS

| 6,317,479 | B1* | 11/2001 | Chiba | ................... | B82Y 10/00 |
| | | | | | 378/34 |
| 2004/0043309 | A1* | 3/2004 | Lin | ............................. | G03F 1/62 |
| | | | | | 430/22 |
| 2004/0119965 | A1* | 6/2004 | Powers | ..................... | G03F 1/62 |
| | | | | | 355/75 |
| 2013/0065160 | A1 | 3/2013 | Lao | | |
| 2017/0082920 | A1 | 3/2017 | Tseng et al. | | |

FOREIGN PATENT DOCUMENTS

JP 2017-032819 A 2/2017

OTHER PUBLICATIONS

European Search Report, European Patent Application No. 17171170.8, dated Nov. 7, 2017, 5 pages.

* cited by examiner

*Primary Examiner* — Hung Nguyen
(74) *Attorney, Agent, or Firm* — McDonnell Boehnen Hulbert & Berghoff LLP

(57) ABSTRACT

The present disclosure provides a lithographic reticle system comprising a reticle, a first pellicle membrane mounted in front of the reticle, and a second pellicle membrane mounted in front of the first pellicle membrane, wherein the first pellicle membrane is arranged between the reticle and the second pellicle membrane, and wherein the second pellicle membrane is releasably mounted in relation to the first pellicle membrane and the reticle.

20 Claims, 3 Drawing Sheets

LITHOGRAPHIC RETICLE SYSTEM

CROSS-REFERENCE TO RELATED APPLICATIONS

The present application is a non-provisional patent application claiming priority to European Patent Application No. 17171170.8, filed May 15, 2017, the contents of which are hereby incorporated by reference.

FIELD OF THE DISCLOSURE

The present disclosure relates to a lithographic reticle system, a lithographic exposure tool and methods for exchanging a pellicle membrane of a lithographic exposure tool.

BACKGROUND

In semiconductor fabrication, various lithographic processes are extensively used in the course of defining devices and circuit patterns. Depending on the size of the features to be defined, different optical lithographic processes may be used. In a lithographic process, a pattern present on a photomask or reticle may be transferred to a light-sensitive photoresist coating by illuminating the reticle. The light is modulated by the reticle pattern and imaged onto a photoresist-coated wafer.

In conventional lithography, a pellicle is commonly placed on the reticle to protect the reticle from contamination during handling and exposure. The pellicle will thus protect the reticle from unwanted particles which otherwise could negatively impact the fidelity of the pattern transfer to the wafer. As the pellicle remains covering the reticle during exposure, there are stringent requirements on the pellicle in terms of absorption, durability, and particle shielding capabilities, etc.

The membrane of the pellicle may however, due to the radiation and/or chemicals in the process environment, degrade over time. Some degradation may be acceptable but eventually the reticle and the pellicle need to be removed from the lithographic exposure tool to allow replacement of the pellicle. The reticle and the pellicle are typically returned to a mask shop where the pellicle replacement may be performed. This may cause undesired interruptions in the fabrication process. Moreover, while the pellicle is being replaced the reticle surface is exposed to the ambient atmosphere and particles existing in the environment.

SUMMARY

An objective of the present disclosure is to address the above-mentioned issues. Further objectives may be understood from the following.

According to a first aspect of the present disclosure there is provided a lithographic reticle system comprising: a reticle, a first pellicle membrane mounted in front of the reticle, and a second pellicle membrane mounted in front of the first pellicle membrane, wherein the first pellicle membrane is arranged between the reticle and the second pellicle membrane, and wherein the second pellicle membrane is releasably mounted in relation to the first pellicle membrane and the reticle.

By the present lithographic reticle system, there is provided a dual-pellicle membrane wherein the second pellicle membrane, by being releasably mounted in front of and in relation to the first pellicle membrane and the reticle, may be conveniently replaced when needed.

By the second pellicle membrane being "releasably mounted in relation to the first pellicle membrane and the reticle" is hereby meant that the second pellicle membrane is mounted such that removal of the second pellicle membrane is allowed while the first pellicle membrane remains mounted in front of the reticle. The first pellicle membrane may accordingly shield or protect the reticle while the second pellicle membrane is being replaced.

Since the first pellicle membrane is arranged between the reticle and the second pellicle membrane, the first pellicle membrane may be shielded from the process environment by the second pellicle membrane.

The present disclosure may obviate or at least reduce the need for returning the reticle to the mask shop for pellicle replacement.

Moreover, as will be further described below, the releasable arrangement of the second pellicle membrane may enable in-situ replacement of the second pellicle membrane, i.e., inside the lithography tool.

Although pellicle degradation and replacement is an issue in the field of lithography at large. It may become an increasing issue in extreme ultraviolet lithography, ("EUVL"), where the short wavelength, high power and the potentially adverse process conditions (for instance due to a hydrogen atmosphere in the reticle chamber environment) may accelerate the degradation of a pellicle membrane. The benefits of the present lithographic reticle system may hence be particularly pronounced in connection with EUVL.

The reticle may be arranged on a reticle support. By "reticle support" is hereby meant a base or a support arranged to act as a support for the reticle in a lithographic exposure tool. The reticle support may be configured to allow releasable mounting of the reticle on the reticle support.

By "reticle", or synomously mask or photomask, is hereby meant a structure or element provided with a pattern which is to be transferred to the wafer or substrate. The reticle may be formed as a reflective reticle. In other words the reticle may be arranged to reflect incident radiation. The reflected radiation may be directed towards the wafer.

The first and the second pellicle membrane may each be formed by a film. The membrane may be formed of a material or a combination of materials presenting a relatively low absorption of the wavelengths used in the lithography exposure tool and preventing or at least counteracting passage of particle contaminants. In an example embodiment, each of the first and second pellicle membrane may present a transmission of at least 90% to light of wavelengths in the range of wavelengths used in the lithographic exposure tool. For instance, each of the first and second pellicle membranes may present a transmission of at least 90% to deep ultraviolet light ("DUV") (such as 193 nm) or extreme ultraviolet ("EUV") (such as below 40 nm, e.g., 13.5 nm).

The first pellicle membrane may be fixedly mounted in front of the reticle. The first pellicle membrane may however also be releasably mounted in relation to the reticle. The first pellicle membrane may be arranged to extend along and in parallel to a main surface of the reticle. The first pellicle membrane may be arranged at a distance from the reticle. The distance may be in the range of 1 mm to 6 mm.

The second pellicle membrane may be arranged to extend along and in parallel to the first pellicle membrane. The second pellicle membrane may be arranged at a distance from the first pellicle membrane. The distance may be in the range of 0.25 mm to 4 mm.

By the first pellicle membrane being arranged, mounted or positioned "in front of" the reticle, is hereby meant that the first pellicle membrane is arranged, mounted or positioned in front of the reticle along (or as seen) in a direction normal to (a reflective or patterned main surface of) the reticle. Correspondingly, by the second pellicle membrane being arranged, mounted or positioned "in front of" the first pellicle membrane, is hereby meant that the second pellicle membrane is arranged, mounted or positioned in front of the first pellicle membrane along (or as seen) in the normal direction to the reticle. In the following, this applies correspondingly to any second feature or element described herein as being arranged "in front of" a first feature or element.

Additionally, a second feature or element, being arranged, mounted or positioned "in front of" a first feature or element may be interchangeably the to be arranged mounted or positioned above the first feature or element. Any reference to other "vertical" qualifiers, for instance "upper", "below", "under", "lower" or the like, may correspondingly be understood to refer to positions as along the normal direction.

According to one embodiment the first pellicle membrane is supported by a first pellicle frame, the first pellicle frame being mounted on the reticle. The first pellicle frame and the first pellicle membrane may form part of a first pellicle. A shielded space above the reticle may hence be defined by the first frame and the first pellicle membrane. A lower or bottom portion of the first frame may be attached to the reticle. The first pellicle membrane may be attached to an upper or top portion of the first frame.

By a second feature or element being "arranged on", "mounted on", "positioned on" or "attached to" a first feature or element is hereby meant that the second feature is arranged, mounted, positioned or attached directly on/to the first feature, i.e., in abutment with the first feature, or with one or more features or elements intermediate the second and the first feature, i.e., not in direct contact with the first feature.

The first pellicle frame may be formed of a material being permeable to gas. This may be beneficial since stress on the first pellicle frame and the first pellicle membrane due to pressure changes, e.g., during loading and unloading, thereby may be reduced.

According to one embodiment, the second pellicle membrane is supported by a second pellicle frame, the second pellicle frame being releasably mounted in relation to the first pellicle membrane and the reticle. The second pellicle frame and the second pellicle membrane may form part of a second pellicle. A shielded space above the first pellicle membrane may hence be defined by the second frame and the second pellicle membrane. The second pellicle membrane may be attached to an upper or top portion of the second frame.

The system may further comprise a reticle support, wherein the reticle is arranged on the reticle support and the second pellicle frame is releasably mounted on and in relation to the reticle support.

The second pellicle membrane (by being supported by the second pellicle frame) may thereby be releasably mounted in relation to the first pellicle membrane and the reticle. A lower or bottom portion of the second frame may be attached to the reticle support.

By the second pellicle frame being mounted on the reticle support, a relatively reliable mounting and unmounting of the second pellicle frame is enabled. Among others, any risk of acts of mounting and unmounting the second pellicle frame causing stress or damage to the first pellicle membrane or first pellicle frame may be mitigated.

Alternatively, the second pellicle frame may be releasably mounted on and in relation to a first pellicle including a first pellicle frame and the first pellicle membrane, the first pellicle frame supporting the first pellicle membrane. By the second pellicle frame being arranged on the first pellicle the second pellicle does not require in any additional point of contact with the reticle.

The second pellicle frame may be releasably mounted on and in relation to the first pellicle frame. The first pellicle frame may provide a comparably strong and reliable support for the second pellicle frame. Moreover, this configuration enables the second pellicle membrane to shield or cover the first pellicle membrane completely.

The second pellicle frame may be arranged in abutment with an outer sidewall surface of the first pellicle frame. A reliable sealing of the space above the first pellicle membrane may hence be achieved by the second pellicle. The second pellicle frame may be arranged to snugly fit about an outer sidewall surface of the first pellicle frame.

Alternatively, the second pellicle frame may be arranged on a top surface of the first pellicle frame. This enables the second pellicle membrane to shield or cover the first pellicle membrane completely, without increasing the foot print of the second pellicle frame beyond that of the first pellicle frame. Correspondingly, the first and the second pellicle membrane may be formed to present the same lateral dimensions. The second pellicle frame may be arranged in abutment with the top surface of the first pellicle frame.

The first pellicle membrane may be attached to the top surface of the first pellicle frame wherein the second pellicle frame may be arranged on the top surface of the first pellicle frame with the first pellicle membrane being intermediate with respect to the first pellicle frame and the second pellicle frame.

According to one embodiment the second pellicle frame includes a mechanical coupling member adapted to releasably engage with a mechanical coupling member of a first pellicle frame (supporting the first pellicle membrane) or of a reticle support adapted to support the reticle.

By the mechanical coupling members being adapted to releasably engage and cooperate with each other, a reliable mounting and convenient removal of the second pellicle frame is enabled.

The mechanical coupling members may be adapted to form a snap lock arrangement.

The mechanical coupling members may be formed as a combination of a flange and a slot adapted to receive the flange. The flange may be adapted to be slidingly received in the slot.

According to one embodiment the second pellicle frame includes a magnetic coupling member adapted to magnetically couple with a magnetic coupling member of a first pellicle frame (supporting the first pellicle membrane) or of a reticle support adapted to support the reticle.

By the magnetic coupling members being adapted to magnetically couple with each other, a reliable mounting and convenient removal of the second pellicle frame is enabled. The magnetic coupling may reliable keep the second pellicle frame in position in relation to the first pellicle frame. The second pellicle frame may be removed by applying a mechanical force exceeding the magnetic coupling force.

One of the magnetic coupling members may include a permanent magnet or an electromagnet. The other magnetic coupling member may include a ferromagnetic material wherein an attractive force may be generated between the magnetic coupling members.

A sealed space may be formed between the first pellicle membrane and the second pellicle membrane. The first pellicle membrane may accordingly be shielded from potentially adverse atmospheric conditions inside the lithographic tool. The sealed space may be defined by at least the first and second membranes and the second pellicle frame.

According to one embodiment, the second pellicle frame includes a gas inlet. A gas inlet may enable pressure equalization during loading and unloading of the mask and the pellicles. A gas inlet may be adapted to allow introduction of species into the sealed space. For instance, species for treating the first and/or second pellicle membrane may be introduced via the gas inlet. The treatment may include cooling of the pellicle membrane(s). The treatment may include forming of a protective coating, which may, for instance, protect the first pellicle membrane from reacting with a hydrogen atmosphere in the lithography tool.

The second pellicle frame may further include a gas outlet. A gas outlet may enable pressure equalization during loading and unloading of the mask and pellicles. A gas outlet may further be adapted to allow removal of species from the sealed space.

According to a second aspect of the present disclosure there is provided a lithographic exposure tool comprising: a light source, a substrate support, a reticle system in accordance with the first aspect, and an optical system for directing light from the light source towards the substrate support via the reticle of the reticle system.

This aspect may generally present the same or corresponding benefits as the former aspect. Reference is therefore made to the above discussion of benefits, variations and details of the first aspect.

By "substrate support" is hereby meant a base or a support arranged to act as a support for the substrate or wafer during exposure. The substrate support may be configured to allow releasable mounting of the substrate on the substrate support.

As discussed above, the reticle of the reticle system may be a reflective reticle wherein the first and the second pellicle membranes may be arranged between the reticle and the substrate support, (as viewed) along the light propagation path between the reticle and the substrate support.

The light source may be an extreme ultraviolet light source. Hence the lithographic exposure tool may be an extreme ultraviolet lithographic exposure tool.

According to a third aspect of the present disclosure there is provided a method for exchanging a pellicle membrane of a lithographic exposure tool, the lithographic exposure tool comprising: a light source, a substrate support, a reticle system in accordance with the first aspect, and an optical system for directing light from the light source towards the substrate support via a reticle of the reticle system, and the method comprising: unloading the reticle, the first pellicle membrane and the second pellicle membrane from the lithographic exposure tool, removing (subsequent to unloading the reticle) the second pellicle membrane in front of the first pellicle membrane, wherein the first pellicle membrane remains on the reticle, releasably mounting a third pellicle membrane in front of the first pellicle membrane, and loading the reticle, the first pellicle membrane and the third pellicle membrane into the lithographic exposure tool.

The second pellicle membrane may accordingly be exchanged or replaced by the third pellicle membrane while the first pellicle membrane remains mounted on the reticle to counteract contamination of the reticle during the replacement.

During the unloading, the first pellicle membrane and the second pellicle membrane remain mounted on the reticle. The reticle, the first pellicle membrane and the second pellicle membrane may accordingly be unloaded as a single unit. During the loading, the first pellicle membrane and the third pellicle membrane are mounted on the reticle. The reticle, the first pellicle membrane and the third pellicle membrane may accordingly be loaded as a single unit.

According to a fourth aspect there is provided a method for exchanging a pellicle membrane inside a lithographic exposure tool, the lithographic exposure tool comprising: a light source, a substrate support, a reticle system in accordance with the first aspect, and an optical system for directing light from the light source towards the substrate support via a reticle of the reticle system, and the method comprising: removing the second pellicle membrane in front of the first pellicle membrane, wherein the first pellicle membrane remains on the reticle, and releasably mounting a third pellicle membrane in front of the first pellicle membrane.

The second pellicle membrane may accordingly be exchanged or replaced by the third pellicle membrane while the first pellicle membrane remains mounted on the reticle inside of the lithographic exposure tool. In-situ replacement of the second pellicle membrane is hence provided. During the replacement, the first pellicle membrane remains mounted on the reticle. The first pellicle membrane may hence counteract contamination of the reticle during the replacement.

The second pellicle membrane may be removed while the reticle is arranged on the reticle support. This enables a time-efficient replacement of the second pellicle. Additionally, the reticle may remain in the relatively protected position on the reticle support during the replacement operation.

The method may further comprise, prior to releasably mounting the third pellicle membrane, loading the third pellicle membrane into a load-lock and transferring the third pellicle membrane to a position in front of the first pellicle membrane.

The method may further comprise, subsequent to removing the second pellicle membrane, transferring the second pellicle membrane to a load-lock of the tool and unloading the second pellicle membrane from the load-lock. The second pellicle membrane may thereby be removed from the tool.

The method may further comprise: subsequent to removing the second pellicle membrane, transferring the second pellicle frame to a storage location of the tool, and prior to releasably mounting the third pellicle membrane, transferring the third pellicle frame form the storage location of the tool to a position in front of the first pellicle membrane. The pellicle exchange may thereby be made even more automatic.

BRIEF DESCRIPTION OF THE FIGURES

The above, as well as additional objects and features will be better understood through the following illustrative and non-limiting detailed description of example embodiments, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
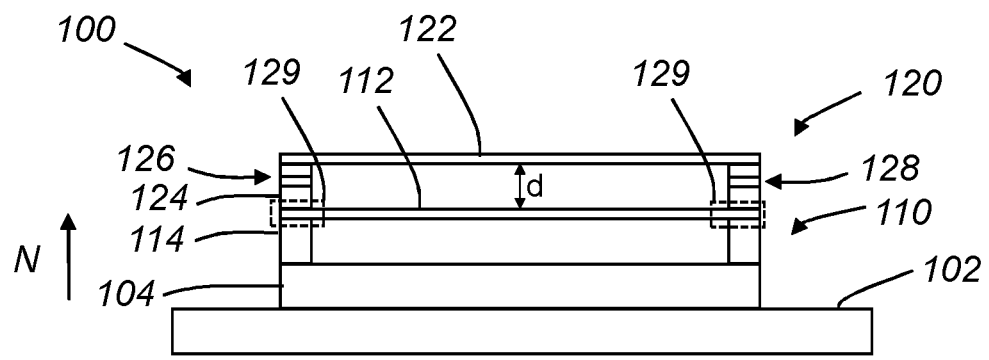
FIG. 1 is a schematic illustration of a reticle system, according to an example embodiment.

FIG. 1 illustrates a cross-sectional side view a lithographic reticle system 100, hereinafter referred to as the system 100. The system 100 comprises a reticle 104. A first pellicle membrane 112 is mounted in front of or above the reticle 104, as viewed along the direction N normal to the reticle 104. A second pellicle membrane 122 is mounted in front of or above the first pellicle membrane 112. Accordingly, the first pellicle membrane 112 is arranged between the reticle 104 and the second pellicle membrane 122, along the direction N. The second pellicle membrane 122 is releasably mounted in relation to the first pellicle membrane 112 and the reticle 104 such that removal of the second pellicle membrane 122, from its position in front of the first pellicle membrane 112 and the reticle 104, is allowed while the first pellicle membrane 112 remains mounted in front of the reticle 104.

The reticle 104 is formed as a reflective reticle. A reflecting pattern which is to be transferred to a substrate may be formed on a main surface of the reticle 104. By way of example, the pattern may reflect incident light such that an optical system may collect the reflected light and direct it further towards the substrate. The reticle 104 may be formed in a conventional manner and in accordance with the wavelength of the light of the lithographic exposure tool in which the reticle 104 is to be used.

The reticle 104 is arranged on a reticle support 102. The reticle support 102 is configured to allow releasable mounting of the reticle 104 on the reticle support 102. The reticle support 102 may be a reticle stage. The reticle support 102 may be adapted to allow attachment of the reticle 104 by means of electrostatic forces or vacuum. However, mechanical attachment (for instance by means of a clamp) or any other conventional securing mechanism are also possible.

The first pellicle membrane 112 may have a rectangular shape, although other shapes such as circular, oval or polygonal shapes also are conceivable. The second pellicle membrane 122 may have a shape corresponding to the shape of the first pellicle membrane 112.

The first pellicle membrane 112 and the second pellicle membrane 122 may be formed of a same material or material combination or of different materials or material combinations. The material(s) may be chosen in accordance with the wavelength of the light of the lithographic exposure tool in which the reticle 104 is to be used.

The first pellicle membrane 112 and/or the second pellicle membrane 122 may be formed by or include one or more layers of a carbon nanotube ("CNT") film. This may be beneficial for EUVL applications.

The CNTs of the CNT film may be single walled CNTs, SWCNTs. Accordingly, each of the at least one CNT film may be formed by SWCNTs. A SWCNT may be described as a cylindrical or tubular molecule of a single graphene sheet. The at least one CNT film may be formed of SWCNTs with a diameter in the range of 0.5-2 nm. SWCNTs may typically present a low absorption of EUV radiation.

The CNTs of the CNT film may also be multiple wall CNTs ("MWCNTs"). Accordingly, each of the at least one CNT film may be formed by MWCNTs. MWCNTs may be described as two or more concentric cylinders of tubes of SWCNTs. The at least one CNT film may be formed by MWCNTs with diameters in the range of 5-30 nm.

A CNT pellicle membrane may be formed as a free-standing CNT membrane, which may refer to any CNT membrane being free-standing or self-supporting in the sense that it is capable of supporting its own weight when being suspended by e.g. a pellicle frame. In other words, a free-standing CNT pellicle membrane is capable of supporting its own weight when having a size being relevant for use in lithography, without appreciable sagging.

By using a free-standing CNT pellicle membrane a pellicle may exhibit a relatively speaking high mechanical strength and low EUV light absorption. Also particle retention properties and chemical resistance of the pellicle may be enhanced.

The CNT pellicle membrane may comprise a plurality of CNT films arranged on top of each other in a stacked fashion. The CNT pellicle membrane may for example include 2, 3, 4 or 10 CNT films just to give a few non-limiting examples. Each CNT film may include a random or regular web or grid of CNTs. The CNT films may be bonded together so as to form the CNT pellicle membrane.

The CNTs may also be bundled within the CNT film in the sense that a plurality of individual CNTs form a bundle (i.e., a string or rope-like structure), wherein the CNT film is formed of a plurality of bundles forming a web of aligned or randomly oriented CNT bundles. A CNT bundle may include for instance 2-20 individual CNTs. In a CNT bundle, individual CNTs may be aligned and joined along their longitudinal directions. CNTs of a bundle may also be joined end-to-end such that the length of the CNT bundle is greater than the length of the individual CNTs. The CNTs may typically be joined by van der Waals forces.

The one or more CNT films may be coated with a metal or semiconductor material. A coating may protect the CNTs of the membrane from the potentially adverse process environments during lithography. Examples of coating materials include B, $B_4C$, ZrN, Mo, Ru, SiC, TiN, a-C, and graphene, or combinations thereof.

Other examples of materials for the first pellicle membrane 112 and/or the second pellicle membrane 122 include fluoropolymers (especially suitable for DUV applications), ceramics, and/or other dielectric coatings.

The system 100 includes a first pellicle 110 including the first pellicle membrane 112 and a first pellicle frame 114 supporting the first pellicle membrane 112. The first pellicle frame 114 may include a number of sidewalls, such as two pairs of mutually opposite sidewalls. The first pellicle frame 114 may be formed by a gas permeable material. The pellicle frame 114 may for instance be formed by Si, SiN, $SiO_2$, or quartz. However other materials are also possible for the pellicle frame 114, such as metal, plastic or ceramic materials to give a few examples.

The first pellicle membrane 112 is attached to a top portion of the first pellicle frame 114. The first pellicle membrane 112 may be attached to the first pellicle frame 114 by means of an adhesive, by welding or the like.

The first pellicle frame 114 defines an opening or aperture above the reticle 104. The first pellicle membrane 112 covers the aperture. The first pellicle membrane 112 is suspended in front of the reticle 104 by the first pellicle frame 114. A height or thickness of the first pellicle frame 114 may be such that a distance between the main surface of the reticle 104 and the first pellicle membrane 112 is in the range of 1 mm to 6 mm.

A bottom portion of the first pellicle frame 114 is attached to the reticle 104. The first pellicle frame 114 may for instance be glued, welded, or otherwise bonded to the reticle.

The system 100 includes a second pellicle 120 including the second pellicle membrane 122 and a second pellicle frame 124 supporting the second pellicle membrane 122. The second pellicle frame 124 may include a number of sidewalls, such as two pairs of mutually opposite sidewalls. The second pellicle frame 124 may for instance be formed by any of the materials discussed in connection with the first pellicle frame 114.

The second pellicle membrane 122 is attached to a top portion of the second pellicle frame 124. The second pellicle membrane 122 may be attached to the second pellicle frame 124 by means of an adhesive, by welding, or the like.

The second pellicle frame 124 defines an opening or aperture above the first pellicle membrane 112. The second pellicle membrane 122 is suspended in front of the first pellicle membrane 112 by the second pellicle frame 124. A height or thickness of the second pellicle frame 124 may be such that a distance (indicated by "d" in FIG. 1) between the first pellicle membrane 112 and the second pellicle membrane 122 is in the range of 0.25 mm to 4 mm.

The second pellicle frame 124 is releasably mounted on the first pellicle 110. More specifically, the second pellicle frame 124 is as shown in FIG. 1 arranged on a top surface of the first pellicle frame 114. The first pellicle membrane 112 may as shown in FIG. 1 be attached to the top surface of the first pellicle frame 114 and completely cover the top surface. Accordingly, the second pellicle frame 124 may be arranged on the first pellicle membrane 112 on the top surface of the first pellicle frame 114 (i.e., on the portion of the first pellicle membrane 112 covering the top surface of the first pellicle frame 114). However, if at least portion of the top surface of the first pellicle frame 114 is exposed by the first pellicle membrane 112 the second pellicle frame 124 may be arranged directly on the top surface of the first pellicle frame 114.

The second pellicle frame 124 may be provided with a coupling member. A corresponding coupling member may be provided on the first pellicle frame 114. The coupling members 129 are indicated in a highly schematic manner by the dashed box in FIG. 1.

The second pellicle frame 124 may be provided with a mechanical coupling member 129 and the first pellicle frame 114 may be provided with a corresponding mechanical coupling member 129. The coupling members 129 may be adapted to releasably engage with each other. Various configurations of mechanical coupling members are possible:

The mechanical coupling members 129 may be adapted to form a snap lock arrangement. One of the coupling members 129 may include a hook and the other coupling member 129 may include a groove. The hook may be adapted to engage with the groove when the second pellicle frame 124 is positioned on the first pellicle frame 114. The groove may for instance be formed in an outer sidewall surface of the first pellicle frame 114 of the second pellicle frame 124. The hook may be formed to extend from an outer sidewall surface of the other pellicle frame 114 and into the groove. The hook may be formed of a resilient material such that the hook may be elastically bent (e.g., in an outward direction with respect to the first and second pellicle frames 114, 124) to disengage from the groove, thereby allowing removal of the second pellicle 120 from the first pellicle 110. The coupling members may include one or more of such hooks and grooves. For instance, hook and groove pairs may be formed on mutually opposite sides of the first and second pellicle frames 114, 124.

The mechanical coupling members 129 may also be formed as a combination of a flange and a slot adapted to receive the flange. The flange may be adapted to be slidingly received in the slot. One of the coupling members 129 may include a slot and the other coupling member 129 may include a flange, a lug or other protrusion, adapted to be received in the slot when the second pellicle frame 124 is positioned on the first pellicle frame 114. The one coupling member 129 may include a pair of mutually opposite slots. The other coupling member 129 may include a pair of mutually opposite flanges adapted to be received in the pair of slots. For instance, a pair of mutually opposite slots may be formed on the top surface of the first pellicle frame 114. A pair of mutually opposite and outwardly protruding flanges may be formed on a bottom portion of the second pellicle frame 124. The second pellicle 120 may accordingly be releasably mounted on the first pellicle 110 reticle support 102 by inserting the flanges into the slots. The slots may be arranged to extend in a direction parallel to the main surface of the reticle 104. The second pellicle 120 may accordingly be mounted on the first pellicle 110 by aligning the flanges with the respective mouths of the slots and moving the second pellicle 120 in a direction parallel to the main surface of the reticle 104. The second pellicle 120 may be unmounted from the first pellicle 110 by reversing the movement.

By thusly or similarly configured coupling members, a simple yet reliable releasable mounting of the second pellicle is provided. Coupling members may also be formed by a clip or clamp arrangement.

The second pellicle frame 124 may alternatively be provided with a magnetic coupling member 129 and the first pellicle frame 114 may be provided with a corresponding magnetic coupling member 129. The coupling members 129 may be adapted to be magnetically coupled to each other. For instance, the first pellicle frame 114 may be provided with one or more permanent magnets or one or more electromagnets. The second pellicle frame 114 may be provided with one or more ferromagnetic material portions wherein a force attracting the second pellicle frame 114 towards the reticle support 102 or the first pellicle frame 114 may be generated when the second pellicle frame 124 is positioned on the first pellicle frame 114. In the case of electromagnets, the electromagnet(s) may be deactivated when the second pellicle frame 124 is to be removed and activated when the second pellicle frame 124 is to be mounted. Alternatively, the second pellicle frame 124 may be provided with one or more permanent magnets or one or more electromagnets and the first pellicle frame 124 may be provided with one or more ferromagnetic material portion.

As shown in FIG. 1, a sealed space is formed between the first pellicle membrane 112 and the second pellicle membrane 122. The space is defined by the inner sidewall surfaces of the second pellicle frame 124, the first pellicle membrane 112 and the second pellicle membrane 122.

The second pellicle frame 124 may as shown includes a gas inlet 126. The gas inlet 126 may be selectively openable, e.g., by means of a valve. The valve may be actuated by a controller of the of the lithographic exposure tool in which the reticle system 100 is intended to be used. The gas inlet 126 may for instance be opened during unloading of the reticle 104 and the first and second pellicles 110, 120 such that a rate of pressure change may be reduced with respect to the first pellicle membrane 112. The gas inlet 126 may however also be used for introduction of species into the sealed space. For instance, species for cooling the first and the second pellicle membranes 112, 122 or otherwise treat them may be introduced via the gas inlet 126. Examples of species include He, B, and N. For this purpose, the lithographic exposure tool may include a gas source (e.g., a He, B, or N source) coupled to the inlet.

The second pellicle frame 124 may further include a gas outlet 128. The gas outlet 128 may be selectively openable, e.g., by means of a valve. The valve may be controlled by electrical means. The gas outlet 128 may for instance be opened during loading of the reticle 104 and the first and second pellicles 110, 120 such that a rate of pressure change may be reduced with respect to the first pellicle membrane 112.

Figure 2:
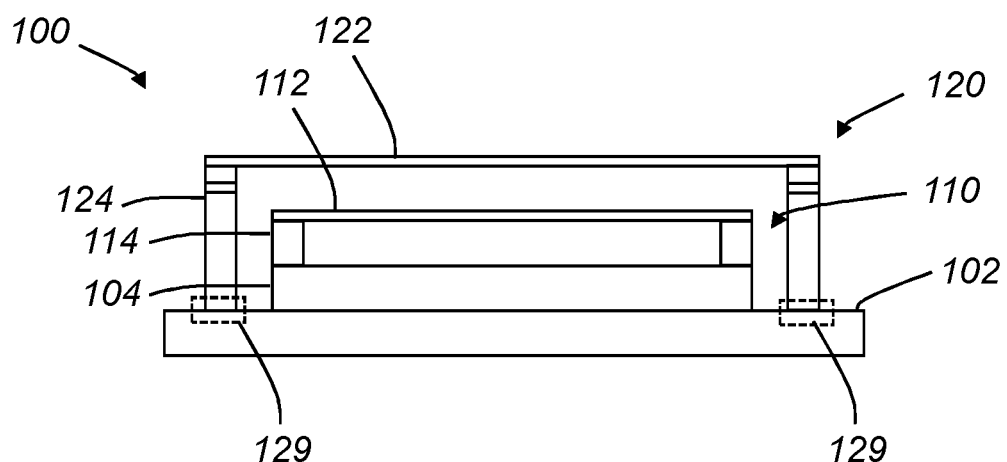
FIG. 2 is a schematic illustration of a variation of the reticle system, according to an example embodiment.

FIG. 2 illustrates a cross-sectional side view of a lithographic reticle system 100 according to a variation of an example embodiment. The system 100 shown in FIG. 2 includes elements corresponding to those in FIG. 1. The system 100 shown in FIG. 2 merely differs from the system 100 shown in FIG. 1 in that the second pellicle frame 124 is arranged on the reticle support 102. The second pellicle frame 124 may be releasably mounted on the reticle support 102 in a similar manner as described with respect to the second pellicle frame 124 and the first pellicle frame 114 in connection with FIG. 1. For instance, a (mechanical or magnetic) coupling member may be provided on the second pellicle frame 124 and a corresponding (mechanical or magnetic) coupling member may be provided on the reticle support 102.

A sealed space is formed between the first pellicle membrane 112 and the second pellicle membrane 122. The space is defined by the inner sidewall surfaces of the second pellicle frame 124, the outer sidewall surfaces of the first pellicle frame 114, the first pellicle membrane 112, and the second pellicle membrane 122.

Figure 3:
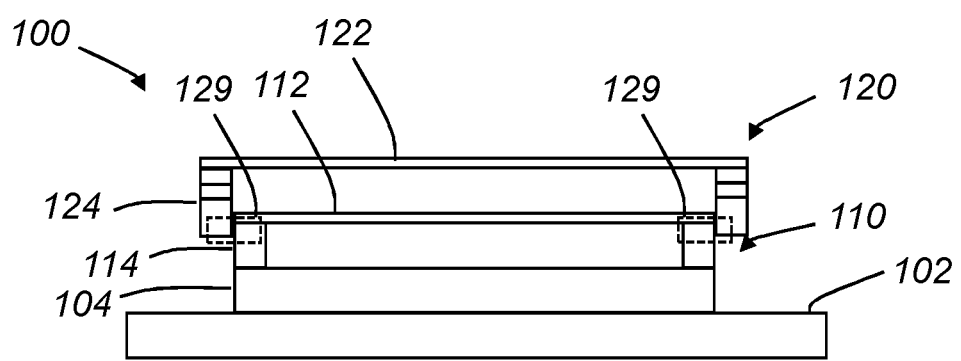
FIG. 3 is a schematic illustration of a further variation of the reticle system, according to an example embodiment.

FIG. 3 illustrates a cross-sectional side view of a lithographic reticle system 100 according to a further variation of an example embodiment. The system 100 shown in FIG. 3 includes elements corresponding to those in FIG. 1. The system 100 shown in FIG. 3 merely differs from the system 100 shown in FIG. 1 in that the second pellicle frame 124 is arranged in abutment with an outer sidewall surface of the first pellicle frame 114. The second pellicle frame 124 is accordingly arranged to grip about, in a snugly fitting manner, about an outer sidewall surface of the first pellicle frame 114. The second pellicle frame 124 may slidably bear against the outer sidewall surfaces of the first pellicle frame 114.

To improve the reliability of the releasable attachment of the second pellicle frame 124 to the first pellicle frame 114, coupling members may be provided as described with respect to the second pellicle frame 124 and the first pellicle frame 114 in connection with FIG. 1.

A sealed space is formed between the first pellicle membrane 112 and the second pellicle membrane 122. The space is defined by the portions of the inner sidewall surfaces of the second pellicle frame 124 protruding above the first pellicle membrane 112, the first pellicle membrane 112 and the second pellicle membrane 122.

Figure 4:
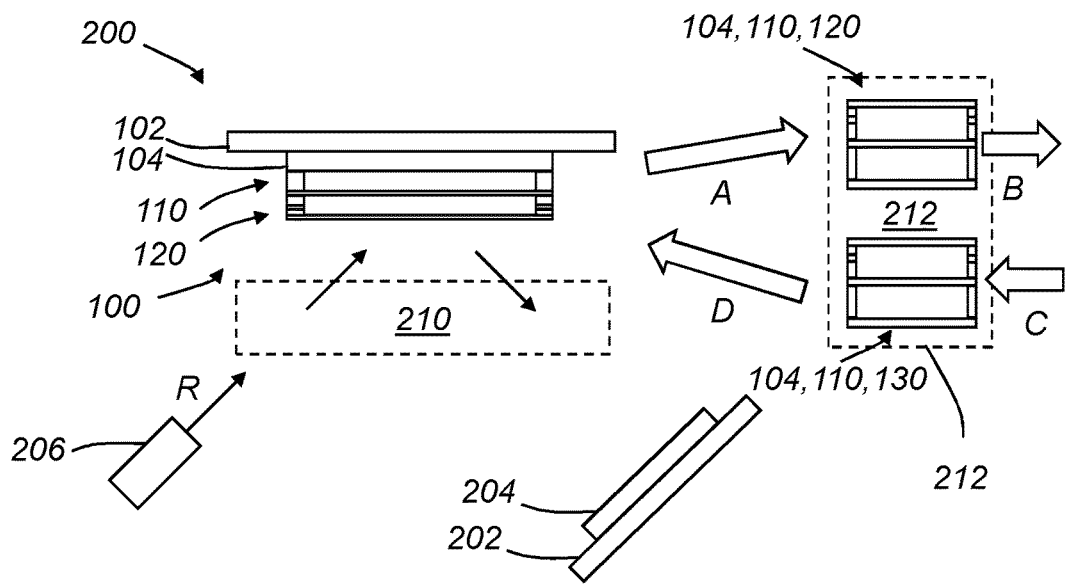
FIG. 4 is a schematic illustration of a lithographic exposure tool and a method of exchanging a pellicle, according to an example embodiment.

FIG. 4 is a schematic illustration of a lithographic exposure tool 200, hereinafter referred to as the tool 200. The tool 200 includes the reticle system 100. The tool includes a light source 206 for emitting light or radiation R. The light source 206 may be a DUV light source or an EUV light source, depending on the type of lithographic tool.

The tool 200 includes a substrate support 202 for supporting a substrate 204 or wafer, which is to be processed.

The tool 200 includes an optical system 210 for directing light from the light source 206 towards the substrate support 202 and the substrate 204 via the reticle 104. As schematically indicated the light R will hence propagate from the light source and pass through the first and second pellicle membranes 112, 122 twice before being incident on the substrate 204.

During a pellicle exchange or replacement method, the reticle 104, the first pellicle 110 and the second pellicle 120 may be unloaded from the tool 200. The reticle 104 may be released from the reticle support 102 and transported by an automatic unloading mechanism to a load lock 212 of the tool 200. This is schematically shown by the arrow A. The combination of the reticle 104, the first pellicle and the second pellicle 120 may subsequently be unloaded from the load lock 212 via a load port of the load lock 212. This is schematically shown by the arrow B.

Outside of the tool 200, the second pellicle 120 may be manually removed from the first pellicle 110. A third pellicle 130 having a third pellicle membrane and being of a same design and configuration as the second pellicle 120 may be releasably mounted on the first pellicle 110. It should be noted that the first pellicle 110 remains mounted on the reticle 104 throughout this operation.

The combination of the reticle 104, the first pellicle 110 and the third pellicle 130 may subsequently be loaded into the load lock 212 via the load port of the load lock 212. This is schematically shown by the arrow C. Following vacuum pumping, the combination of the reticle 104, the first pellicle 110 and the third pellicle 130 may be transported by an automatic loading mechanism to the reticle support 102. This is schematically shown by the arrow D. The loading mechanism may be implemented in a manner corresponding to a conventional loading mechanism of a conventional lithographic exposure tool. The reticle 104 may be arranged on the reticle support 102. Lithographic operation may then be commenced.

Figure 5:
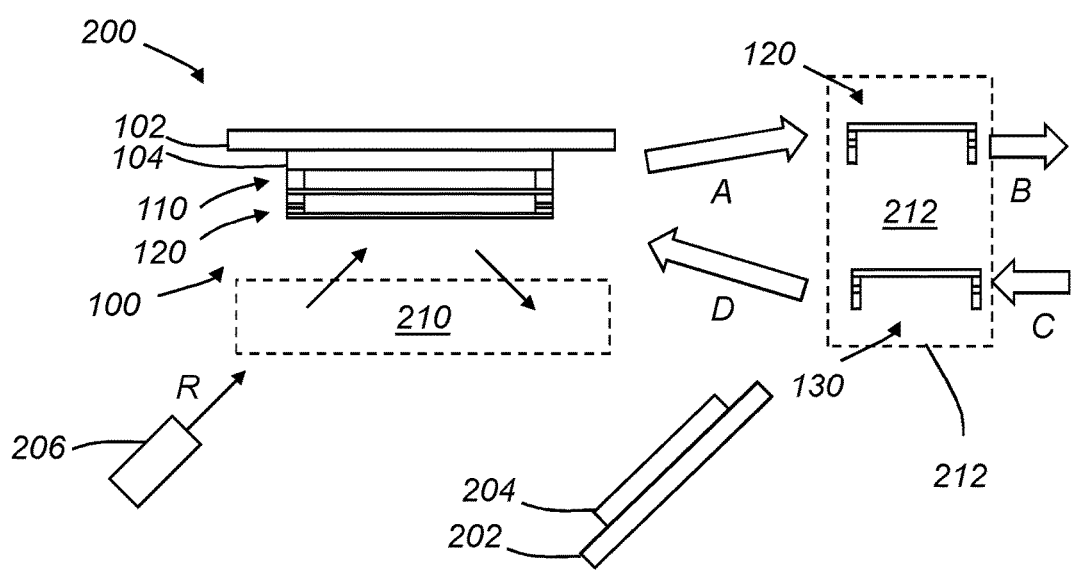
FIG. 5 is a schematic illustration of a lithographic exposure tool and a method of exchanging a pellicle inside the tool, according to an example embodiment.

FIG. 5 is a schematic illustration of a lithographic exposure tool 200 corresponding to the tool 200 shown in FIG. 4. In FIG. 5 is however a different pellicle exchange method shown.

Instead of unloading the combination of the reticle 104, the first pellicle 110 and the second pellicle 120, the second pellicle 120 is removed from the first pellicle 110 while the reticle 104 and the first pellicle 110 remains on the reticle support 102. The second pellicle 120 is subsequently transferred to the load lock 212. This is schematically shown by the arrow A. The tool 200 may include a mechanism for disengaging the coupling members of the first and second pellicles 110, 120 from each other. The second pellicle 120 may subsequently be unloaded from the load lock 212 via a load port of the load lock 212. This is schematically shown by the arrow B.

A third pellicle 130 having a third pellicle membrane and being of a same design and configuration as the second pellicle 120 may loaded into the load lock 212 through the load port thereof. This is schematically shown by the arrow C. Following vacuum pumping, the third pellicle 130 may be transported by an automatic loading mechanism to the reticle support 102 and be mounted on the first pellicle 110. The loading mechanism may be implemented in a manner corresponding to a conventional loading mechanism of a conventional lithographic exposure tool. This is schematically shown by the arrow D. The tool 200 may include a mechanism for engaging the coupling members of the first and third pellicles 110, 130 with each other. Lithographic operation may then be commenced.

Alternatively, the second pellicle 120 may be transferred to a storage location (not shown), for instance, a pellicle cartridge, of the tool 200. The second pellicle 120 may for instance be transferred to a portion of the storage location intended for used pellicles. Correspondingly, the third pellicle 130 may be transferred from the storage location to the reticle support 102 and be mounted on the first pellicle 110. The third pellicle 130 may for instance be transferred from a portion of the storage location intended for un-used pellicles. The pellicle exchange may thereby be made even more automatic. The storage location may be emptied and/or replenished as needed during maintenance of the tool 200.

In the above, the disclosure has mainly been described with reference to a limited number of examples. However, as is readily appreciated by a person skilled in the art, other examples than the ones disclosed above are equally possible within the scope of the disclosure, as defined by the appended claims. For instance, although in the above the first pellicle 110 has been shown to have a same footprint as the reticle 104, it is also possible to form the first pellicle 110 with a smaller footprint than the reticle 104. This may be suitable for instance if the pattern is formed on only a sub-region of the main surface of the reticle 104. In such a configuration, the second pellicle 120 may be releasably mounted on the main surface of the reticle 104. Moreover, in FIGS. 4 and 5 the tool 200 was described in connection with the reticle system 100 shown in FIG. 1. However, it is equally possible to use the variations of the reticle system 100 shown in FIGS. 2 and 3 in the tool 200.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A lithographic reticle system comprising:
a reticle;
a first pellicle membrane mounted in front of the reticle;
a second pellicle membrane mounted in front of the first pellicle membrane,
wherein the first pellicle membrane is arranged between the reticle and the second pellicle membrane,
wherein the second pellicle membrane is releasably mounted in relation to the first pellicle membrane and the reticle, and
wherein a sealed space is formed between the first pellicle membrane and the second pellicle membrane;
a first pellicle frame supporting the first pellicle membrane; and
a second pellicle frame supporting the second pellicle membrane,
wherein the second pellicle frame includes a magnetic coupling member adapted to magnetically couple with a magnetic coupling member of the first pellicle frame or of a reticle support adapted to support the reticle.

2. The system according to claim 1, wherein the first pellicle frame is mounted on the reticle.

3. The system according to claim 1, wherein the second pellicle frame is releasably mounted in relation to the first pellicle membrane and the reticle.

4. The system according to claim 1, wherein the second pellicle frame is releasably mounted on and in relation to the reticle support.

5. The system according to claim 1, wherein the second pellicle frame is releasably mounted on and in relation to the first pellicle frame.

6. The system according to claim 5, wherein the second pellicle frame is arranged in abutment with an outer sidewall surface of the first pellicle frame.

7. The system according to claim 5, wherein the second pellicle frame is arranged on a top surface of the first pellicle frame.

8. The system according to claim 1, wherein the second pellicle frame includes a mechanical coupling member adapted to releasably engage with a mechanical coupling member of the first pellicle frame or of the reticle support.

9. The system according to claim 1, wherein the first pellicle frame and the second pellicle frame are formed by a gas permeable material, and wherein the gas permeable material comprises silicon, silicon mononitride, silicon dioxide, quartz, metal, plastic, or ceramic materials.

10. The system according to claim 8, wherein the mechanical coupling member is adapted to form a snap lock arrangement.

11. The system according to claim 1, wherein an attractive force is generated between the magnetic coupling members by a permanent magnet, an electromagnet, or a ferromagnetic material.

12. The system according to claim 1, wherein the second pellicle frame includes a gas inlet.

13. The system according to claim 1, wherein the first pellicle membrane and the second pellicle membrane are separated by a distance.

14. A lithographic exposure tool comprising:
a light source,
a substrate support,
the reticle system according to claim 1, and
an optical system for directing light from the light source towards the substrate support via the reticle of the reticle system.

15. The lithographic exposure tool according to claim 14, wherein the light source is an extreme ultraviolet light source.

16. A method for exchanging a pellicle membrane of the lithographic exposure tool according to claim 14, the method comprising:
   unloading the reticle, the first pellicle membrane, and the second pellicle membrane from the lithographic exposure tool;
   removing the second pellicle membrane in front of the first pellicle membrane, wherein the first pellicle membrane remains on the reticle;
   releasably mounting a third pellicle membrane in front of the first pellicle membrane; and
   loading the reticle, the first pellicle membrane, and the third pellicle membrane into the lithographic exposure tool.

17. A method for exchanging a pellicle membrane inside the lithographic exposure tool according to claim 14, the method comprising:
   removing the second pellicle membrane in front of the first pellicle membrane, wherein the first pellicle membrane remains on the reticle; and
   releasably mounting a third pellicle membrane in front of the first pellicle membrane.

18. The method according to claim 17, further comprising:
   loading the third pellicle membrane into a load-lock of the lithographic exposure tool prior to releasably mounting the third pellicle membrane; and
   transferring the third pellicle membrane to a position in front of the first pellicle membrane.

19. The method according to claim 17, further comprising:
   transferring the second pellicle membrane to a load-lock of the lithographic exposure tool prior to removing the second pellicle membrane; and
   unloading the second pellicle membrane from the load-lock.

20. The method according to claim 17, further comprising:
   transferring the second pellicle frame to a storage location of the tool subsequent to removing the second pellicle membrane; and
   transferring a third pellicle frame from the storage location of the tool to a position in front of the first pellicle membrane prior to releasably mounting the third pellicle membrane.

* * * * *